United States Patent

Le et al.

[11] Patent Number: 5,859,569
[45] Date of Patent: Jan. 12, 1999

[54] CURRENT FEEDBACK DIFFERENTIAL AMPLIFIER CLAMP

[75] Inventors: Hieu M. Le, Midway City; Lloyd F. Linder, Agoura Hills; Erick M. Hirata, Torrance; Benjamin Felder, Saugus; Roger N. Kosaka, Torrance; Donald G. McMullin, Rancho Santa Margarita; Kelvin T. Tran, Carson, all of Calif.

[73] Assignee: Raytheon Company, El Segundo, Calif.

[21] Appl. No.: 843,200

[22] Filed: Apr. 14, 1997

[51] Int. Cl.[6] .............................. H02H 7/20; H03M 1/12
[52] U.S. Cl. ...................... 330/298; 330/207 P; 341/155
[58] Field of Search ..................................... 327/309, 323, 327/327; 330/252, 259, 207 P, 298; 341/155

[56] References Cited

U.S. PATENT DOCUMENTS

| | | | |
|---|---|---|---|
| 4,166,983 | 9/1979 | Lacroix | 330/207 P X |
| 4,780,689 | 10/1988 | Saller et al. | 330/267 |
| 5,410,274 | 4/1995 | Birdsall et al. | 330/265 |
| 5,471,175 | 11/1995 | Chiu et al. | 330/298 |
| 5,530,444 | 6/1996 | Tice et al. | 341/156 |

*Primary Examiner*—Steven Mottola
*Attorney, Agent, or Firm*—Leonard A. Alkov; William C. Schubert; Glenn H. Lenzen, Jr.

[57] ABSTRACT

A current steering circuit diverts bias current from a differential current summing amplifier's front end when the differential input exceeds a safe threshold level, thus preventing the amplifier's output stage from being overdriven. Diverting the front end's bias currents also turns off transistors within the amplifier's front end and thus protects the front end from damage which may otherwise result from excessive input signals.

9 Claims, 3 Drawing Sheets

CURRENT FEEDBACK DIFFERENTIAL AMPLIFIER CLAMP

GOVERNMENT RIGHTS

This invention was made with U.S. government support, and the government has certain rights in the invention.

BACKGROUND OF THE INVENTION

1. Field of the Invention

The invention relates generally to differential amplifiers and, more specifically, to clamps for current feedback differential amplifiers.

2. Description of the Related Art

Voltage feedback amplifiers are used in applications in which high linearity and low distortion are primary requirements. However, voltage feedback amplifiers are inherently slow in operation due to a requirement for charging or discharging stray capacitances at circuit nodes in order to change the voltage at those nodes.

Current feedback amplifiers are capable of much faster operation than typical voltage feedback amplifiers since the charging current available for charging and discharging the capacitances at circuit nodes can be significantly greater. Other well known advantages of current feedback amplifiers include fast slew rates and fixed bandwidth vs gain. Two key disadvantages of current feedback amplifiers are related to their low impedance feedback input node with its intrinsic linearity limits and excessive shot current noise.

A conventional current feedback amplifier may include a class AB push-pull input stage in the form of a transconductance amplifier as disclosed in U.S. Pat. No. 4,780,689, entitled "AMPLIFIER INPUT CIRCUIT", issued Oct. 25, 1988 to K. Saller et al. Two such A/B cells can be used as the front end of a differential feedback amplifier, as illustrated in U.S. Pat. No. 5,410,274, entitled "SINGLE-ENDED AND DIFFERENTIAL AMPLIFIERS WITH HIGH FEEDBACK INPUT IMPEDANCE AND LOW DISTORTION", issued Apr. 25, 1995 to Dwight Birdsall et al.

Cancellation of common mode modulation errors introduced in input stage amplifiers has been accomplished by cross-connecting the back end amplifier outputs with the front end inputs through resistive feedback loops and interconnecting the front end amplifier outputs through a resistor. The overall amplifier has low shot noise since both of its voltage input terminals have high impedance,is fully differential, and achieves the advantages of voltage and current feedback.

High impedance clamps have been connected to the inputs of the back end amplifiers so that, whenever the front end input signals exceed a threshold, the clamps limit the signals at the inputs to the output amplifiers, thus ensuring that these amplifiers are not overdriven. However, the back-end outputs are also clamped and the feedback loop is effectively opened. As a result, any further increase in the input signal appears across the resistor connecting the outputs of the front end amplifiers. Since this resistor is generally between 5 $\Omega$ and 10 $\Omega$, the resulting current could be quite large and may damage or destroy the front end amplifiers.

SUMMARY OF THE INVENTION

The invention is directed to a clamp circuit which prevents the output stage of differential current summing amplifiers from being overdriven while, at the same time, protecting the front end of such an amplifier.

The invention comprises a comparator circuit and current steering circuit. The comparison circuit compares the differential voltage across the inputs of a differential amplifier to a threshold value. The current steering circuit is controlled by the comparison circuit and diverts current from the biasing circuit of the differential amplifier's input stage. When the voltage across the inputs of the differential amplifier exceeds a threshold value the comparison circuit activates the current steering circuit, thereby turning off the output transistors of the amplifier's input stage. In the preferred embodiment, the transistors are turned off whenever the difference exceeds the threshold value, regardless of the polarity of the differential input signal.

An optional reverse biasing circuit may be added to the new clamp to further reverse bias the base-emitter junctions of the input stage amplifiers and further ensure that the differential amplifier's input section is totally shutdown whenever the input voltage exceeds a predetermined threshold.

A differential current summing amplifier including the new clamp is particularly suited for application in a subranging analog-to-digital converter (ADC). Switching transients often occur in such ADCs and can be coupled to the differential input of a current summing amplifier used in such ADCs. Excessive voltages may also be presented to the ADC input for other reasons. The new clamp circuit protects the input section of the ADC's amplifier from such transients without substantially slowing the ADC operation.

These and other features, aspects and advantages of the invention will be apparent to those skilled in the art from the following detailed description, taken together with the accompanying drawings.

DETAILED DESCRIPTION OF THE INVENTION

The new clamp circuit employs a current steering circuit which diverts bias current from a differential amplifier's input stage whenever the differential input voltage exceeds a preset threshold.

Figure 1:
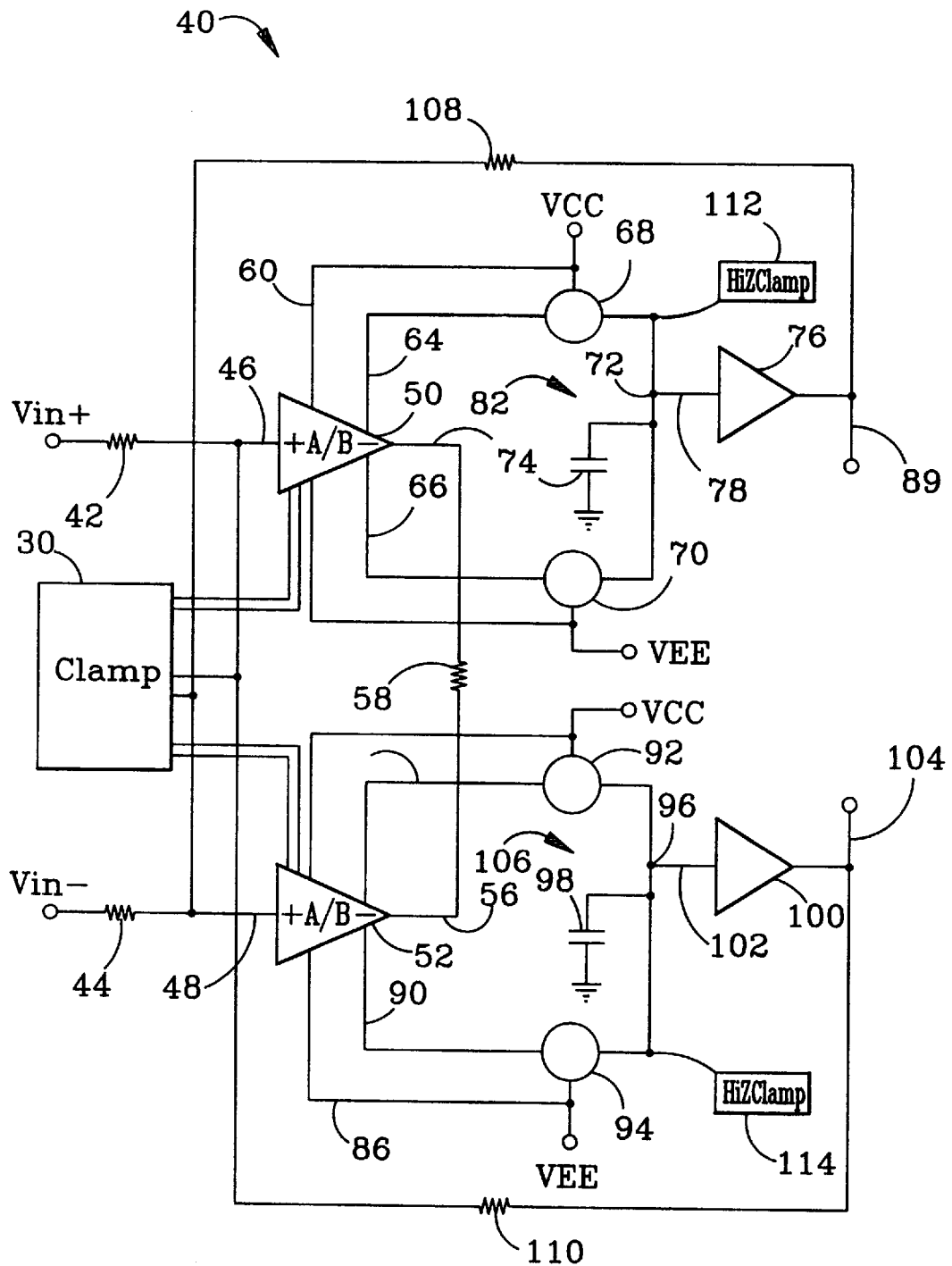
FIG. 1 is an electrical schematic diagram of a new differential amplifier which includes a novel clamping circuit.
Figure 2:
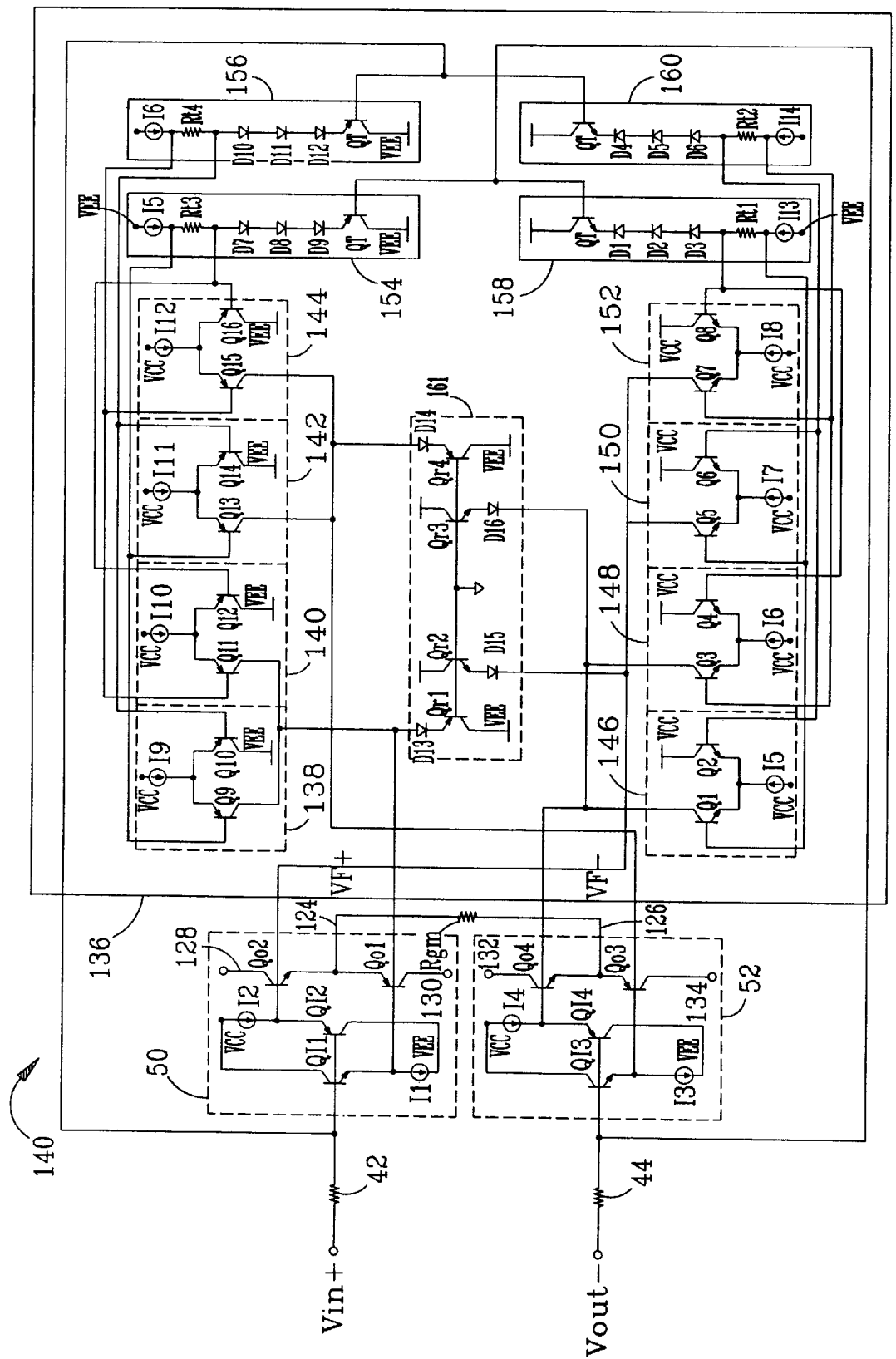
FIG. 2 is an electrical schematic of the front end of the differential amplifier of FIG. 1 with a detailed schematic diagram of the novel clamping circuit.

FIG. 1 illustrates a preferred embodiment of a differential current feedback amplifier 40 which employs A/B cells discussed in greater detail in relation to FIG. 2. Differential input signals Vin+ and Vin− are applied through input resistors 42 and 44 to high impedance voltage input terminals 46 and 48 of current feedback transconductance amplifiers 50 and 52 respectively. The novel clamp 30 is connected to the amplifiers 50 and 52 and to the input terminals 46 and 48. Low impedance current feedback input terminals 54 and 56 of the amplifiers 50 and 52 are interconnected by a resistor Rgm.

The amplifier 50 has power supply terminals 60 and 62 which are connected to the supplies VCC and VEE respectively, and push-pull current output terminals 64 and 66 which are connected through current mirrors 68 and 70 to a high impedance node 72. An integrating compensation capacitor 74 is connected between the node 72 and signal ground. A transconductance amplifier 76 has a voltage input terminal 78 connected to the node 72 and a voltage output terminal 89 which produces an output signal Vout+. The node 72, capacitor 74 and amplifier 76 constitute a transimpedance amplifier 82.

The amplifier 52 has power supply terminals 84 and 86 which ar connected to the supplies VCC and VEE respectively, and push-pull current output terminals 88 and 90 which are connected through current mirrors 92 and 94 to a high impedance node 96. An integrating current compensation capacitor 98 is connected between the node 96 and signal ground. A transconductance amplifier 100 has a voltage input terminal 102 connected to the node 106 and a voltage output terminal 104 which produces an output signal Vout−. The node 96, capacitor 98, and amplifier 100 constitute a transimpedance amplifier 106.

Negative feedback can be obtained by cross-connection. More specifically, the voltage output terminal 80 of the amplifier 76 is connected through a feedback resistor 108 to the voltage input terminal of the amplifier 52, whereas the voltage output terminal 104 of the amplifier 100 is connected through a feedback resistor 110 to the voltage input terminal 46 of the amplifier 50. Cancellation of the common mode modulation errors introduced in the amplifiers 50 and 52 is accomplished by the cross-connected feedback loops and the interconnection of the feedback inputs 74 and 56 by the resistor 58. The amplifier 40 has low shot noise since both voltage input terminals 46 and 48 have high impedance. The amplifier 40 is fully differential, and achieves the advantages of voltage and current feedback.

High impedance clamps 112 and 114 are connected to the respective inputs of amplifiers 76 and 100. Whenever input signals Vin+ and Vin− exceed a threshold, the clamps 112 and 114 limit the signals at the inputs 78 and 102, respectively, thus ensuring that the output amplifiers 76 and 100 will not be overdriven. However, the output signals, Vout− and Vout+ are also clamped and the feedback loop is effectively opened. As a result, any further increase in the input signal appears across the resistor Rgm. Since this resistor is generally between 5 Ω and 10 Ω, the resulting current could be quite large and may damage or destroy amplifier 50 or 52, which comprise the from end of the differential amplifier 40. The clamp 30 diverts current from the font end amplifiers to prevent such an occurrence.

The electrical schematic diagram of FIG. 2 includes two AB cells 50 and 52 which act as the front end of a differential amplifier 40. Only the front end of the amplifier and the new clamp circuit 136 are illustrated in this figure. The AB cells 50 and 52 comprise respective NPN bipolar transistor Qi1 and Qi3 each having a collector connected to a positive power supply VCC and respective emitters connected through constant current sources I1 and I3 to a negative power supply VEE. PNP bipolar transistors Qi2 and Qi4 have their collectors connected through constant current sources I2 and I4, respectively, to the positive power supply VCC, and their collectors connected to VEE. A differential input voltage is applied through voltage input terminals Vin+ and Vin− and respective input resistors 42 and 44 to the bases of the transistors Qi1,Qi2 (for Vin+) and Qi3, Qi4 (for Vin−).

NPN transistors Qo2 and Qo4 have their bases connected to the emitters of the transistors Qi2 and Qi4, respectively, and their emitters connected to the emitters of PNP transistors Qo1 and Qo3, respectively. The bases of the transistors Qo1 and Qo3 are connected to the emitters of the transistor Qi1 and Qi3, respectively. The emitters of the transistors Qo2 and Qo1 are connected to a current feedback input terminal 124, while those of transistors Qo4 and Qo3 are connected to a current feedback input terminal 126. The collectors of transistors Qo2, Qo1, Qo4 and Qo3 are connected to push-pull current output terminals 128, 130, 132 and 134 respectively.

The current sources I1, I2, I3 and I4 cause constant bias currents to flow which set up suitable quiescent bias currents through the transistors Qi1, Qi2, Qi3, Qi4, Qo1, Qo2, Qo3 and Qo4. As the respective input signals Vin+ and Vin− change, the voltages at the emitters of transistors Qi1, Qi2, Qi3, Qi4, Qo1, Qo2, Qo3 and Qo4 follow. More specifically, the voltages at the emitters of the transistors Qi1, Qi3 and Qi2, Qi4 are one forward-biased diode drop Vbe below and above the respective input voltages Vin+ and Vin−, and voltages Vf+ and Vf− at the front end output terminals 124 and 126, taken at the connected emitters of Qo1/Qo2 and Qo3/Qo4 respectively are substantially equal to Vin+ and Vin−. A resistor Rgm is connected between terminals 124 and 126 to cancel common mode errors.

Although the terminals 124 and 126 are ostensibly push-pull voltage output terminals, they function in the amplifier as current feedback input terminals and will be referred to as such since they receive a current feedback input from a source external to the amplifier. Since the emitters of the transistors Qo2/Qo1 and Qo4/Qo3 are connected to the terminals 124 and 126 respectively, the impedances presented by the terminals 124 and 126 to an external circuit are low, and current can flow into or out of the terminals 124 and 126.

The new clamping circuit 136 includes current steering cells which compare the voltage across the differential input terminals Vin+ and Vin− to a threshold voltage and, when that threshold is met, divert bias current from the amplifier's front end output transistors, i.e., Qo1, Qo2, Qo3 and Qo4, thereby turning these transistors off and preventing excessive current flow through the resistor Rgm.

Current steering cells 138 and 140 are connected to divert bias current from the base of transistor Qo1, cells 142 and 144 and connected to divert bias current from base of the transistor Qo3, cells 146 and 148 are connected to divert current from the base of transistor Qo4 and cells 150 and 152 are connected to divert bias current from the base of transistor Qo2. Threshold circuits 154, 156, 158 and 160 level shift the input signals Vin+ and Vin− and establish threshold voltages for comparison by the current steering cells. An optional reverse biasing circuit 161 is connected to further reverse bias the base emitter junctions of the output transistors Qo1–Qo4 whenever the current steering cells shut these transistors off.

Each current steering cell comprises a differential pair of bipolar transistors and a current source. Cells 146, 148, 150 and 152 include NPN bipolar transistors Q1 and Q2, Q3 and Q4, Q5 and Q6 and Q7 and Q8, with each pair having their emitters connected through respective current sources I5, I6, I7 and I8 to the negative supply terminal VEE. The collectors of transistors Q2, Q4, Q6 and Q8 are connected to the positive supply terminal VCC. Similarly, cells 138, 140, 142, and 144 include PNP bipolar transistors Q9 and Q10, Q11 and Q12, Q13 and Q14, and Q15 and Q16, with each pair having their emitters connected through respective current sources I9,I10,I11 and I12 to the positive supply terminal VCC. The collectors of transistors Q10, Q12, Q14 and Q16 are connected to the negative supply terminal VEE.

Since the operation of all the cells 138–152 is similar, as is the operation of the threshold circuits 154–160, the operation of only one cell need be described in detail. Cell 152 is connected to steer bias current from the base of transistor Qo2. The threshold circuit 158 includes an NPN transistor Qt1 connected at its collector to the positive supply terminal VCC, at its base to the amplifier's inverting input Vin− and at its emitter to three series connected diodes, D1–D3, which are connected through a resistor Rt1 and current source I13 to the negative supply terminal VEE. Assuming that the base-emitter voltage of Qt1 and that of each of the forward diode drops equal 0.7 V, the base of transistor Q8 is at (vin−)—2.8 V. Similarly, the threshold circuit 160 includes an NPN transistor Qt2 connected at its collector to the positive supply terminal VCC, at its base to the amplifier's noninverting input Vin+ and at its emitter to three series connected diodes, D4–D6, which are connected through a resistor Rt2 and current source I14 to the negative supply terminal VEE. In the preferred embodiment resistor Rt2 and the current source I14 are selected to produce a 200 mV drop across Rt2. Assuming that the base-emitter voltage of Qt1 and that of each of the forward diode drops equal 0.7 V, the base of transistor Q7 is at (Vin+)—3.0 V.

During normal operation, node 46 and node 48 are at approximately ground level. So long as node 46 does not exceed node 48 by more than 200 mV transistor Q7 remains off and the differential pair's tail current I8 is supplied by transistor Q8. However, should Vin+ be greater than Vin− by more than 200 mV, transistor Q8 will turn off, transistor Q7 will turn on and the tail current I8 will be supplied by the current source I2. In the preferred embodiment, the tail currents I5–I12 are of the same magnitude as the bias currents I1–I4, and consequently all of the bias current I2 is diverted to transistor Q7 and the transistor Qo2 shuts off. Similarly, voltage differences, of either polarity, which exceed the Vin+, Vin− threshold will turn off the transistors Qo1–Qo4, thus blocking current flow through the resistor Rgm and thereby protecting amplifiers 50 and 52.

The optional reverse biasing circuit 161 includes two PNP transistors Qr1 and Qr4 connected at their collectors to the negative supply terminal VEE and at their respective emitters through diodes D13 and D14 to the bases of transistors Qo1 and Qo3. NPN transistors Qr2 and Qr3 are connected at their collectors to the positive supply terminal VCC and at their respective emitters through diodes D15 and D16 to the bases of transistors Qo2 and Qo4. The bases of transistors Qr1–Qr4 are connected to signal ground. During normal operation, i.e., with the bias currents I1–I4 not diverted to the clamping circuit 136, all the transistors Qr1–Qr4 are off. Whenever the input signals are overdriven, i.e., the voltage across the Vin+ and Vin− terminals exceed a threshold voltage, transistors Q1, Q3, Q5, Q7, Q9, Q11, Q13, and Q15 turn on and supply currents to transistors Qr1–Qr4, turning them on and clamping the voltages at the bases of Qo1 and Qo3 at approximately two diode voltage drops above ground and the bases of transistors Qo2 and Qo4 at approximately two diode voltage drops below ground. The emitters of Qo1–Qo4 are forced to ground, thus reverse biasing their base-emitter junctions.

Figure 3:
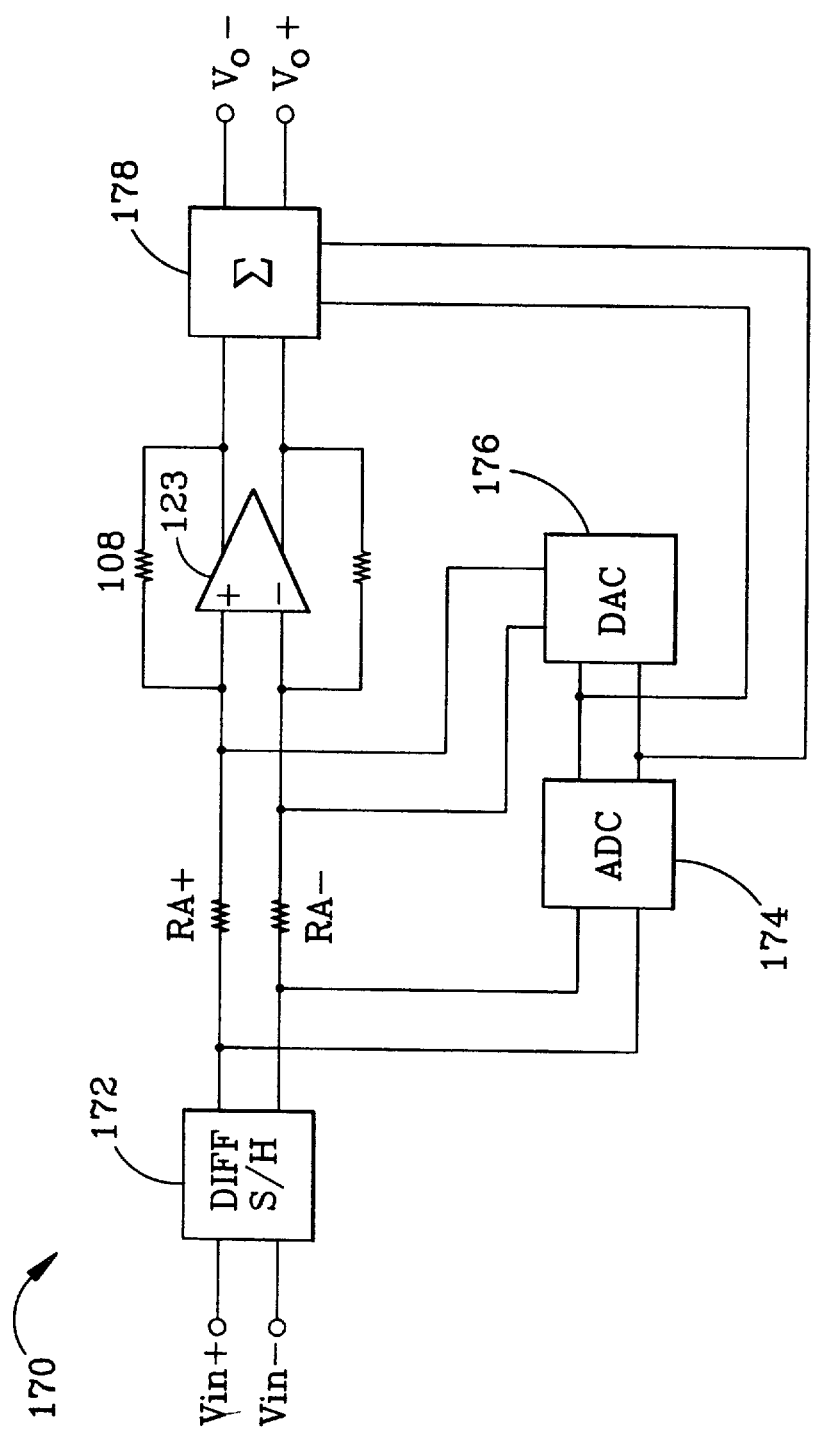
FIG. 3 is an electrical block diagram illustrating a subranging ADC including the amplifier of FIG. 1

FIG. 3 illustrates a subranging analog-to-digital converter (ADC) 170 which utilizes the amplifier 40, designated by a single amplifier symbol. Differential analog inputs Vin+ and Vin− are applied to a differential sample and hold circuit 172, the outputs of which are applied through the resistors RA+ and RA− to the voltage input terminals (+) and (−) of the amplifier 40. The outputs of the circuit 172 are also applied through a course bit ADC 174 and a digital-to-analog converter (DAC) 176 directly to the input terminals (+) and (−).

The output currents of the circuit 172 and the DAC 176 are subtractively summed at the input terminals (+) and (−). The output of the circuit 172 represents the entire input signal, whereas the output of the DAC 176 represents a coarse approximation thereof, obtained, for example, by truncation. The difference between the outputs of the circuit 172 and DAC 176 is the difference between the original input signal and the coarse approximation, or the subrange. The subrange signals are amplified by the amplifier 40 and applied to a logic unit 178 which converts the subrange signals to digital form and combines them with the coarse digital signals from the ADC 174 to reconstruct the input signal in digital form.

The subranging function enables the ADC 170 to have a relatively fine resolution while utilizing ADCs with relatively coarse resolution, or number of bits. This reduces the cost of the ADC 170. However, in various applications high amplitude portions of a signal, or switching transients, may be inadvertently applied to the input terminals Vin+, Vin− with possible damage to the front end of the amplifier 40 resulting, as previously discussed. The invention prevents such damage.

The forgoing description of specific embodiments of the invention has been presented for the purposes of illustration and description. It is not intended to be exhaustive or to limit the invention to the precise forms disclosed, and many modifications and variations are possible in light of the above teachings. For example,the new clamp circuit may be employed to advantage in a variety of amplifiers and ADCs having various architectures. The embodiments were chosen and described in order to best explain the principles of the invention and its practical application, to thereby enable others skilled in the art to best utilize the invention. It is intended that the scope of the invention be limited only by the claims appended hereto.

We claim:

1. A differential amplifier, comprising:
 a differential input stage having differential voltage inputs with said inputs connected to amplifiers with output terminals connected through a resistor at respective current feedback inputs, and
 a current clamp comprising:
  a comparison circuit connected to said differential input terminal to compare the voltage across said input terminals to a threshold value, comprising
   (i) a differential pair of transistors having a tail current, and
   (ii) a threshold circuit, said threshold circuit connected to provide voltages at the control terminals of said differential pair representative of a differential voltage appearing across the input terminals of said amplifier, with a threshold voltage added to said input differential input voltage, and
  a current diverting circuit connected to divert said amplifier's bias current and to be controlled in said diversions by said comparison circuit.

2. The differential amplifier of claim 1, wherein said threshold circuit and differential pair are connected to divert the tail current of said differential pair from the bias current source of said amplifier whenever the differential input voltage exceeds said threshold voltage.

3. The differential amplifier of claim 2, said input stage including a plurality of bipolar output transistors, wherein said current clamp further comprises a reverse biasing circuit connected to reverse bias the base-emitter junctions of said transistors when the differential input voltage exceeds said threshold voltage.

4. A subranging analog-to-digital converter comprising:

a sample and hold circuit connected to receive and hold a differential analog signal, an analog-to-digital converter connected to receive the held analog signal from said sample and hold circuit and to convert said analog signal to a digital signal, a digital to analog converter connected to convert said digital signal from the analog to digital converter into an analog signal, and a differential amplifier connected to receive analog signals from said sample and hold circuit and from said digital to analog converter and to produce an analog signal based upon those inputs, said amplifier comprising:

a differential input stage having differential voltage inputs with said inputs connected to amplifiers whose outputs are connected through a resistor at respective current feedback inputs, and a current clamp comprising:

a comparison circuit connected to said differential input terminals to compare the voltage across said input terminals to a threshold value, and a current diverting circuit connected to divert said amplifier's bias current and to be controlled in said diversion by said comparison circuit.

5. The subranging analog-to-digital converter of claim 4, wherein said comparison circuit comprises:

a differential pair of transistors having a tail current, and a threshold circuit, said threshold circuit connected to provide voltages at the control terminals of said differential pair representative of a differential voltage appearing across the input terminals of said amplifier, with a threshold voltage added to said input differential input voltage.

6. The subranging analog-to-digital converter of claim 5, wherein said threshold circuit and differential pair are connected to divert the tail current of said differential pair from the bias current source of said amplifier whenever the differential input voltage exceeds said threshold voltage.

7. The subranging analog-to-digital converter of claim 6, said input stage including a plurality of bipolar output transistors, wherein said current clamp further comprises a reverse biasing circuit connected to reverse bias the base-emitter junctions of said transistors when the differential input voltage exceeds said threshold voltage.

8. A differential amplifier, comprising:

a differential input stage having differential voltage inputs with said inputs connected to amplifiers whose output terminals are connected through a resistor at respective current feedback inputs, and a clamp circuit connected to divert bias current from the input stage when the voltage across the differential inputs exceeds a threshold value, wherein said clamp circuit includes a comparison circuit connected to said differential input terminals to compare the voltage across said input terminals to a threshold value, and a current diverting circuit connected to divert said amplifier's bias current and to be controlled in said diversion by said comparison circuit, wherein said comparison circuit comprises:

a differential pair of transistors having a tail current, and a threshold circuit, said threshold circuit connected to provide voltages at the control terminals of said differential pair representative of a differential voltage appearing across the input terminals of said amplifier, with a threshold voltage added to said input differential input voltage.

9. A method of protecting a differential amplifier from excessive input signals comprising:

sensing the amplifier's input signal, in response to the sensed input signal exceeding a predetermined safe threshold value, diverting bias current from said amplifier to prevent it being damaged, and reverse biasing the base emitter junctions of transistors within the amplifier in response to sensed input signals exceeding a predetermined safe threshold value.

* * * * *